United States Patent [19]
Rombult et al.

[11] Patent Number: 5,889,547
[45] Date of Patent: Mar. 30, 1999

[54] REGISTRATION DETECTION APPARATUS FOR IMAGING SYSTEMS

[75] Inventors: Philip A. Rombult, Bradford; Akim Lennhoff, Cambridge, both of Mass.

[73] Assignee: Bayer Corporation — Agfa Division, Wilmington, Mass.

[21] Appl. No.: 868,969

[22] Filed: Jun. 4, 1997

[51] Int. Cl.[6] .............................. B41J 2/47; B41L 47/14
[52] U.S. Cl. .................. 347/262; 347/116; 347/264; 271/230; 271/259
[58] Field of Search .................................. 347/116, 262, 347/264; 346/134; 271/229, 230, 231, 256, 258.01, 259, 261; 355/75

[56] References Cited

U.S. PATENT DOCUMENTS

| | | | |
|---|---|---|---|
| 1,991,003 | 2/1935 | Stevens | 271/230 |
| 2,011,745 | 8/1935 | Wormser | 271/230 |
| 5,345,870 | 9/1994 | Bailey et al. | 355/72 |
| 5,488,906 | 2/1996 | Iron et al. | 346/138 |
| 5,655,452 | 8/1997 | Blake et al. | 101/477 |
| 5,669,539 | 9/1997 | Mallows et al. | 226/26 |
| 5,699,099 | 12/1997 | Garand et al. | 347/172 |

*Primary Examiner*—Alan A. Mathews
*Attorney, Agent, or Firm*—Alfred A. Stadnicki

[57] ABSTRACT

A registration apparatus for positioning a medium on a media support surface, includes a moveable member and a registration member. The moveable member is contacted by an edge of a medium, and moves therewith as the medium is moved to a set position on a support surface. The registration member restrains the movement of the moveable member, at the point at which the moveable member contacts the registration member, to position the medium at the set position on the support surface.

19 Claims, 8 Drawing Sheets

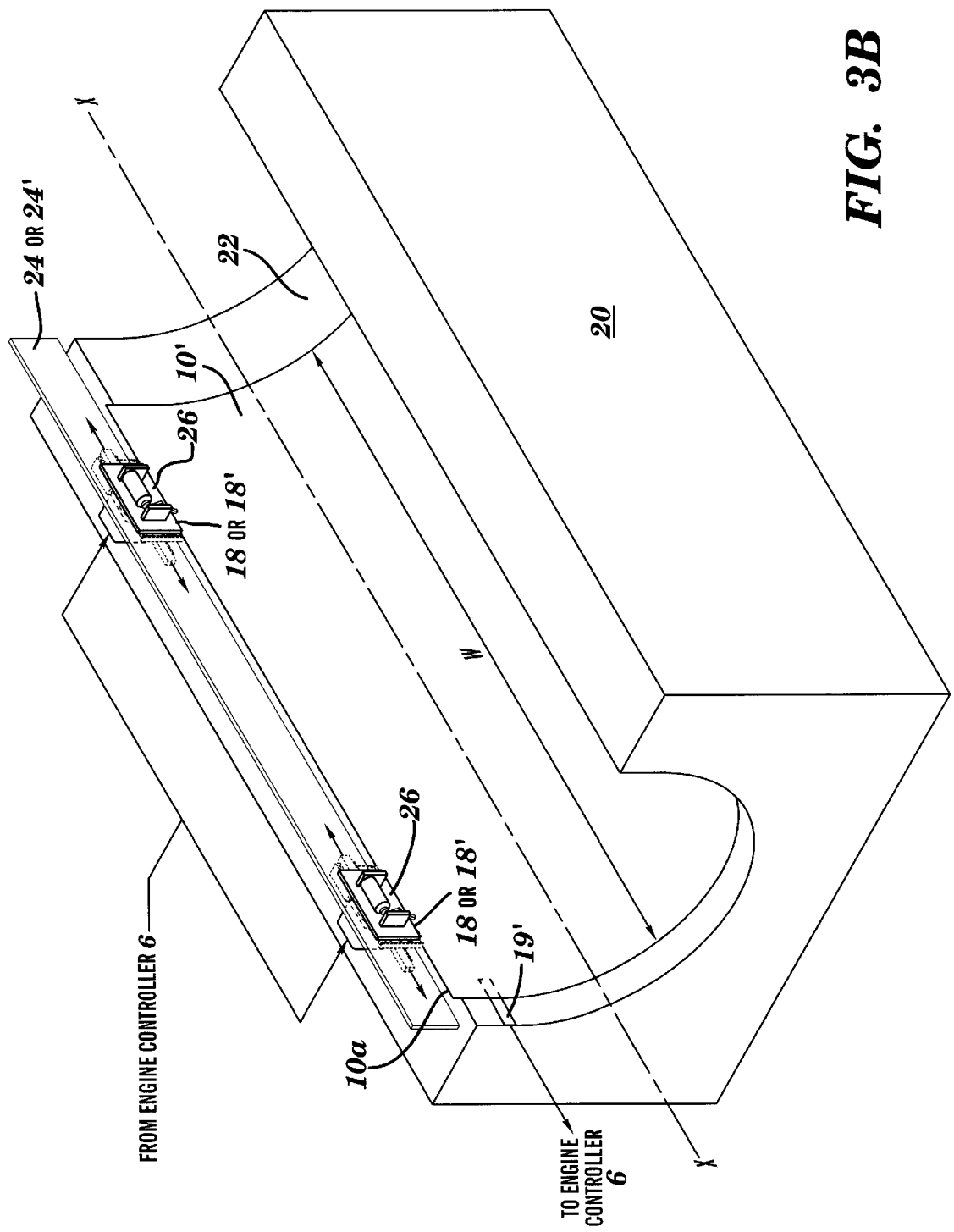

REGISTRATION DETECTION APPARATUS FOR IMAGING SYSTEMS

RELATED APPLICATIONS

The present application is related to simultaneously filed copending U.S. application Ser. Nos. 08/868,720, entitled "IMAGING SYSTEM WITH MOVABLE REGISTRATION PINS", 08/868,970, entitled "IMAGING SYSTEM WITH HIGH EFFICIENCY MEDIA LOADING", 08/867,128, entitled "A METHOD AND APPARATUS FOR SELECTIVELY DRAWING AIR FROM A PLURALITY OF VACUUM CHANNELS", 08/868,526, entitled "METHOD AND APPARATUS FOR HOLDING RECORDING MEDIA ONTO A MEDIA SUPPORT SURFACE".

1. Technical Field

The present invention relates to properly registering media in imaging systems such as platesetters and imagesetters and more particularly to a registration detection apparatus for imaging systems.

2. Background Art

Modern imagesetters and platesetters utilize optical scanners to write or record images for subsequent reproduction or to read a prerecorded image at a predefined resolution rate. Such scanners may write or record images on or read prerecorded images from various media including photo or thermal sensitive paper or polymer films, photo or thermal sensitive coatings or erasable imaging materials, an aluminum or other metal base printing plate, or other type media. The medium is typically mounted on an imaging surface which may be planar or curved and then scanned with an optical beam.

The primary components of modern imagesetting and platesetting systems include an image processor to generate and/or edit an image, a raster image processor (RIP) for converting data signals from the image processor into signals which can be understood by a controller which controls the imaging by the imagesetter or platesetter. The imagesetter or platesetter itself typically includes an imaging head such as a scan assembly which is often disposed and movable within a drum cylinder in which the recording or recorded medium is mounted. The controller, in accordance with the signals from the RIP and its own programmed instructions, generates signals to control the optical scanning so as to write images on or read images from the medium mounted within the drum cylinder by scanning one or more optical beams over the inside circumference of the drum cylinder while the cylinder itself remains fixed. A typical scan assembly of a cylindrical drum type imager system may include a spin mirror or other optical device to direct the light beam over the inside circumference of the drum cylinder, as will be well understood by one skilled in the art.

In order to provide quality imaging, it is imperative that the medium to be imaged be properly positioned on the support surface of the imaging system. Conventionally, registration pins, punches or notches are utilized for this purpose. In this regard, the applicable registration devices are fixedly mounted along the medium support surface such that, when the medium is loaded into the imaging system it is positioned against the registration devices. Although suitable for use in imaging systems which are intended to image only media of one width, such fixed registration devices are less than ideal for use in imaging systems which are intended to image media of varying widths.

Typically, it is assumed that the medium being loaded onto the support surface prior to imaging is properly positioned by forcing the medium to be imaged against the registration devices. However, if the medium is being loaded in a skewed disposition, the medium may contact less than all the registration devices and therefore be skewed on the support surface at the time of imaging.

To confirm proper contact between the loaded medium and the registration device, it has been proposed to provide electric detection circuits which are closed when a metallic medium contacts a metallic registration device. However, such circuits can only confirm whether or not the medium is properly positioned and are useless when a non-metallic medium is being imaged.

OBJECTIVES OF THE INVENTION

It is therefore an object of the present invention to provide a registration apparatus capable of detecting the proper positioning of media on a medium support surface prior to imaging.

It is a further object of the present invention to provide a registration apparatus which ensures proper alignment registration of the medium to be imaged as it is loaded onto the medium support surface.

It is a another object of the present invention to provide registration apparatus which ensures proper alignment registration of the medium to be imaged whether or not the medium is electrically conductive.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto.

Those of ordinary skill in the art having access to the teachings herein will recognize additional implementations, modifications, and embodiments, as well as other fields of use, which are within the scope of the invention as disclosed and claimed herein and with respect to which the invention could be of significant utility.

SUMMARY DISCLOSURE OF THE INVENTION

In accordance with the present invention, a registration apparatus is provided for positioning a medium, whether metallic or non-metallic, on a media support surface. The positioning may be for the purposes of imaging, processing, or printing, or for some other purpose. The apparatus includes a moveable member, such as a registration pin, which is contacted by an edge of the medium. The moveable member is moved, e.g., pushed, by the medium edge as the medium is moved to a desired set or registration position on a support surface. A registration member, such as a registration bar, restrains the movement of the moveable member at the point, i.e. the location or position, at which the moveable member contacts the registration member. The registration member preferably has a reference surface, which the moveable member contacts and which is aligned substantially parallel to the edge of the medium with the medium in the set position. By restraining further movement of the moveable member, the medium is positioned at the set position on the support surface.

In accordance with other aspects of the invention, the moveable member is moveable in a direction parallel to the reference surface of the registration member. A drive mechanism, e.g. a carriage assembly, drives the movement of the moveable member parallel to the reference surface.

Beneficially, the drive mechanism contacts the reference surface to thereby provide a fixed relative positioning of the moveable member and the reference surface when the moveable member is not in contact with the edge of the medium.

According to other aspects of the invention, a guide mechanism, connected to the moveable member, guides the movement of the moveable member towards the registration member. A spring is provided to apply a separation force to maintain a separation of the moveable member and registration member when the moveable member is not in contact with the medium edge. Hence, the spring, to some extent, resists the force applied by the medium edge to move the moveable member towards the registration member.

In accordance with still other aspects of the invention, the moveable member bar and the registration member are both formed of electrically conductive material. A detection circuit is connected to an electrical power source and to connections at the moveable member and the registration member. The contact of the moveable member with the registration member closes the detection circuit, thereby causing a current to flow within the circuit. The current can be sensed to detect the contact of the moveable member and registration member.

Alternatively and preferably, an optical or other radiation emitter, e.g. a light emitting diode, is arranged to direct a radiating beam between the moveable member and the registration member. An optical or other detector, e.g. a photodetector, detects the radiating beam passing between the moveable member and the registration member. When the moveable member comes into contact with the registration member, the radiating beam is blocked and therefore undetectable by the detector. The failure of the detector to generate a signal can be sensed to detect the contact of the moveable member with the registration member.

BRIEF DESCRIPTION OF THE DRAWINGS

FIG. 3 depicts a registration assembly including the registration pin and registration bar depicted in FIG. 1.

BEST MODE FOR CARRYING OUT THE INVENTION

Figure 1:
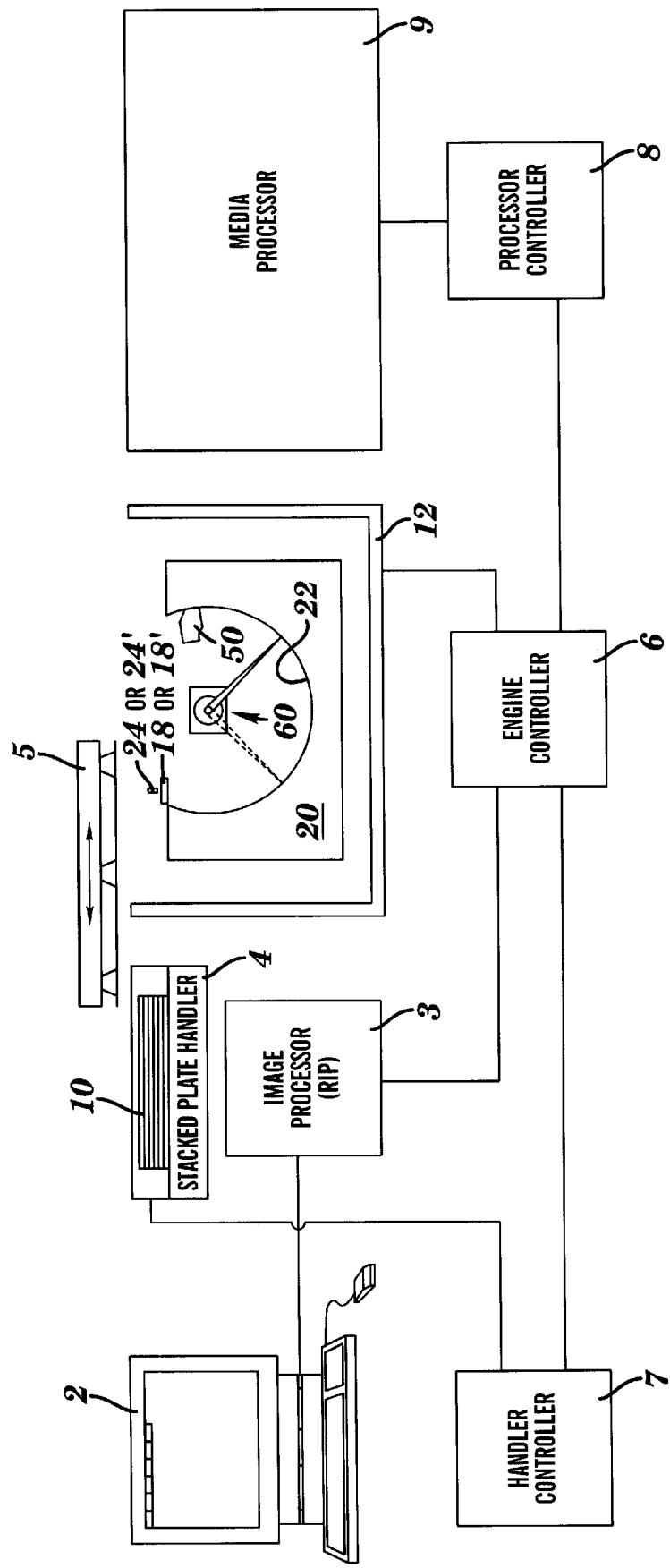
FIG. 1 depicts an imaging system in accordance with the present invention.

FIG. 1 depicts an imaging system in accordance with the present invention. As shown, the imaging system includes a computer 2 which may be a personal computer, a workstation, or virtually any type of computing device and may form part of an operator control panel. The computer 2 allows images to be created or edited and serves as a general input device. For example, the computer 2 can be utilized to select a particular scanning resolution to be used in imaging during a particular operational sequence.

The imaging system further includes a stacked plate handler 4 which is controlled by the handler controller 7. The stacked plate handler 4 stores media 10 of various sizes in different cassettes, as will be described further below. The computer 2 can be utilized by the system operator to input commands identifying the desired plate size. The computer 2 will then generate a signal, responsive to which the handler controller 7 controls the handler 4 such that plates from the applicable cassette within the handler 4 are made accessible to a plate picker 5. The plate picker 5 removes a plate from the handler 4 and conveys the plate to the loading device or applicator 50 of the scan engine 12 which is controlled by engine controller G.

Images are transmitted from the computer 2 to the raster image processor (RIP) 3 which converts the digitized signals received from the computer 2 into signals which can be understood by the engine controller 6 which controls the scan engine 12. The scan engine 12 includes the plate picker 5 which operates in conjunction with the stacked plate handler 4 and the applicator 50 to move individual plates from the handler 4 to the applicator 50 for loading.

Once the plate has been loaded onto the mounting surface 22 of the cylindrical drum 20, it is scanned by a scanning light beam radiating from moving scan assembly 60 in accordance with the instructions from the engine controller 6 responsive to the signals received from the RIP 3. As indicated in FIG. 1, the scan engine 12 includes a registration pins 18 or 18' and registration bar 24 or 24' which are utilized to properly position the medium on the support surface 22 of the cylindrical drum 20 during loading. The image is recorded by scanning the light beam parallel to the registration bar 24 or 24'. Recorded media is then transferred to the media processor 9 which is controlled by the processor controller 8 in accordance with signals received from the RIP 3 to develop or otherwise process the imaged plate. The processed plate is then removed from the system.

A subsequent operation may include mounting the plate onto a plate notcher. The notcher may include registration means for registering the leading edge of the plate and transferring the leading edge registration by notching the plate for subsequent mounting onto a press. Alternatively, the plate may be mounted directly onto a press cylinder using the leading edge of the plate for registration. In each alternative, registration means would be located at substantially the same positions as the registration pins of the imaging system. These registration means could be similar to the registration pins 18 or 18' and registration bar 24 or 24'.

Figure 2:
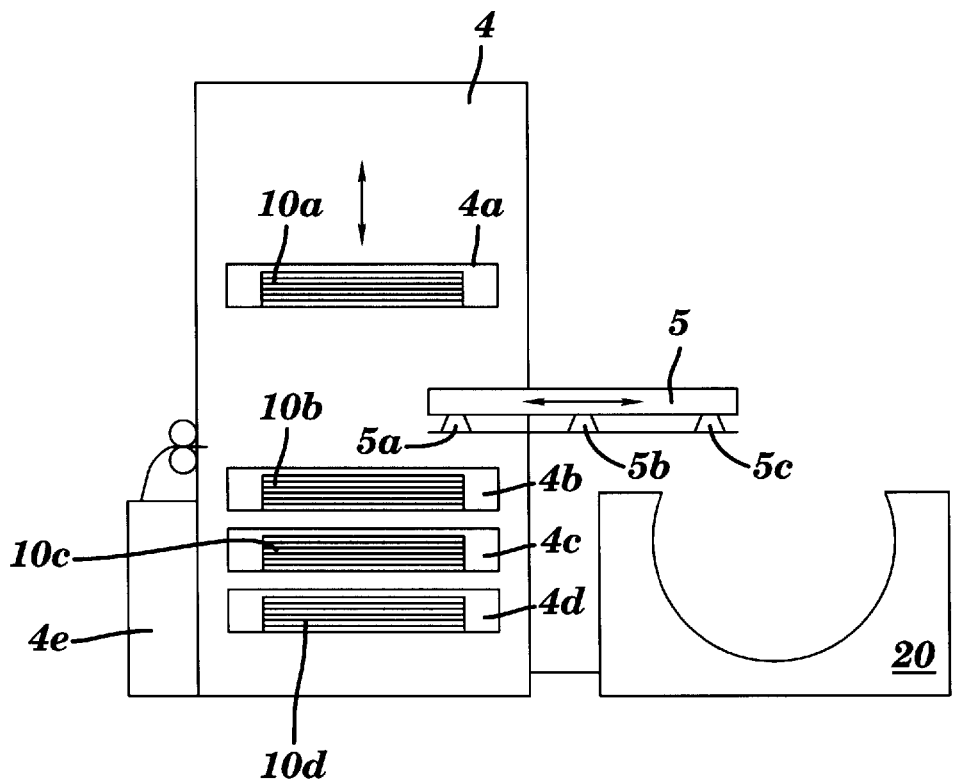
FIG. 2 further details the stacked plate handler depicted in FIG. 1.

FIG. 2 provides a more detailed depiction of the handler 4 and individual media cassettes 4a–d. The handler 4 also includes slip sheet remover 4e for removing slip sheets between plates stacked within each cassette. As indicated, the cassettes are movable vertically to position a desired cassette below the plate picker 5 to provide a plate of a selected size. The plate picker 5, using suction devices 5a–5c, lifts the plate from the handler cassette 4b, as shown, and then conveys the individual plate to the applicator 50 of FIG. 1 for loading into the cylindrical drum 20. As shown in FIG. 2, each of the cassettes 4a–4d stores a different sized plate. The plates in the respective cassettes have different widths. The width, as used herein, is intended to refer to the dimension which, when the plate is loaded onto the support surface of the internal drum, is measured in a direction parallel to the longitudinal axis of the drum, as will be discussed in more detail below.

Hence, the system operator can identify a desired plate size using the computer 2 by, for example, selecting one of multiple plate sizes displayed on a monitor of the computer 2, or inputting a desired plate size or cassette number representing the cassette in which plates of the desired size are stored, to generate a signal to the RIP 3. The signal is transformed by the RIP 3 into an appropriate signal to the handler controller 7. The controller 7 controls the handler 4 in the manner previously described such that plates of the desired size can be conveyed by the plate picker 5 to the applicator 50 of the engine 12.

Figure 3A:
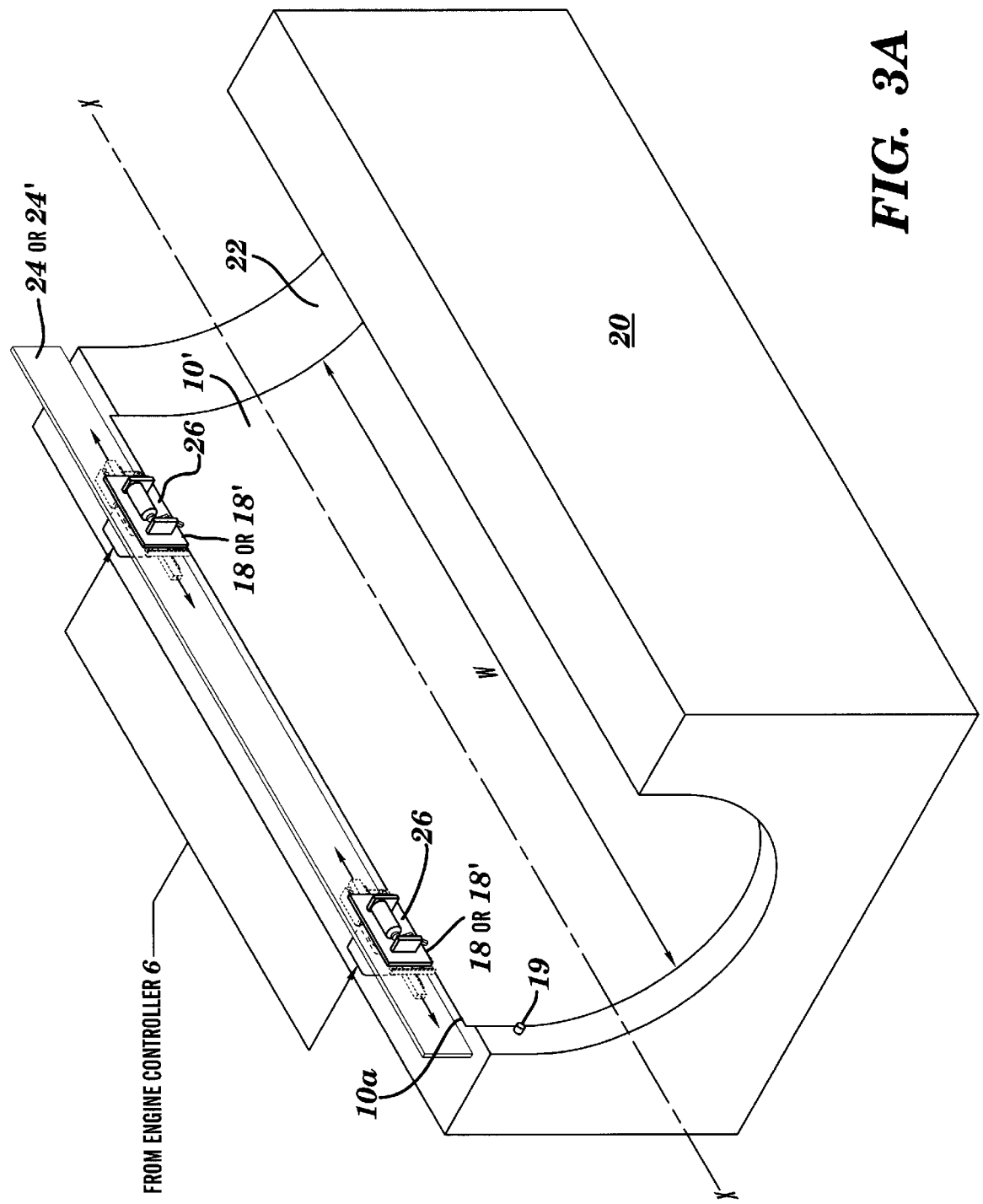
FIG. 3A is similar to FIG. 3 but with an edge detector substituted for the left edge registration pin.

FIG. 3 depicts the cylindrical drum 20 with a sheet of medium 10' loaded therein. The medium 10' has a width W measured parallel to the longitudinal axis X—X of the cylindrical drum 20. The medium 10' is loaded such that the leading edge 10a of the medium 10' contacts the registration pins 18 or 181 which, as will be detailed further below, are thereby moved into contact with the registration bar 24 or 24'. The medium is left justified at a desired position either against a registration pin 19 or using an edge detector assembly 19'. If a left edge registration pin 19 is utilized, it may be preferable to fix the left side registration pin 18 or 18' with respect to the registration bar 24 or 24'. On the other hand, if an edge detector 19' is used, as shown in FIG. 3A, it will be preferable to have both registration pins 18 and 18' adjustable. As shown in FIG. 3A, the left edge detector 19' is a large area light detector which is recessed in the drum 20. The detector 19' detects light from the scanning light beam over the portion of the detector now covered by the plate. The detector 19' generates a signal representing the location of the edge of the plate on the detector. The signal is transmitted to the controller 6 which, on the basis of the identified location of the side edge of the plate, begins the imaging a predefined number of scan lines from the edge.

A drive assembly 26 attaches the registration pin 18 or 18' to the registration bar 24 or 24'. In accordance with signals received from the engine controller, the drive assembly moves the registration pins 18 or 18' parallel with the axis X—X of the cylindrical drum 20 to adjust the positioning of the registration pins 18 or 18' on the registration bar 24 or 24' in accordance with the plate size identified on the computer 2. Accordingly, as indicated by the two-headed arrows at each of the drive assemblies 26, each drive assembly 26 can be moved further towards or away from the respective ends of the registration bar 24 or 24', depending upon the selected plate size, to move each of the pins 18 or 18' to a position corresponding to the width of the plate to be imaged.

Figure 4B:
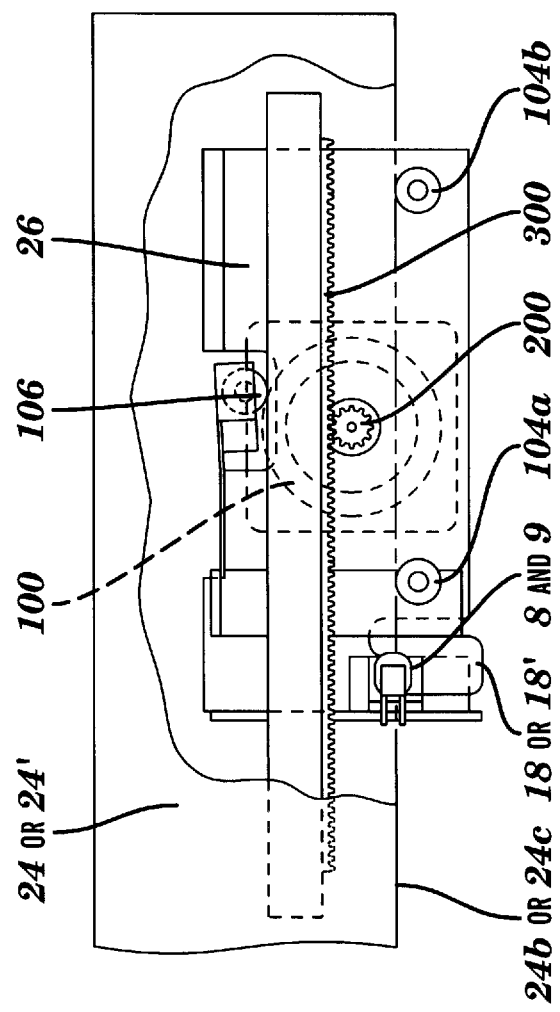
FIG. 4B is a front view of the movement assembly shown in FIG. 4A.
Figure 4A:
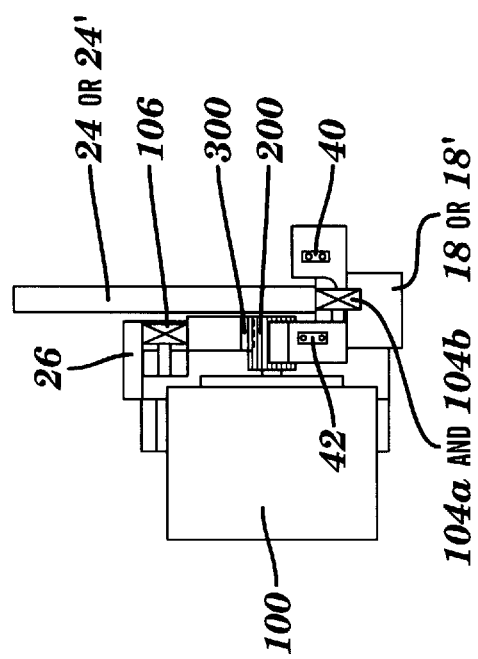
FIG. 4A is a side view of the movement assembly 26 of FIG. 3.

FIGS. 4A and 4B detail the movement assembly 26. FIG. 4A depicts a side view of the movement assembly. As shown, the assembly includes a stepper motor 100 which drives a gear 200. The gear 200 engages a rack 300 to drive the assembly 26 along the registration bar 24 or 24' Ball bearings 104a and 104b ride along the bottom surface 105 of the registration bar 26. The ball bearings 104a and 104b are preloaded against the bottom surface 105 of the registration bar 24 or 24' due to the action of a preload bearing 106 which rides along the top surface of the rack 300. It should be noted that the rack 300 is shown to extend only along a portion of the registration bar but could if desired extend along the full length of the registration bar 24 or 24' to provide the greatest flexibility in locating the registration pins. As the stepper motor turns, the gear 200 rotates and propels the assembly 26 along the longitudinal axis of registration bar 24 or 24', which is aligned parallel to the longitudinal axis of the drum 20. Since the bearings 104a and 104b ride along the same lower surface 24b or 24c of the registration bar 24 or 24' which the registration pin 18 or 18' contacts as the register reference, the alignment of the registration pin 18 or 18' with respect to the registration bar contact surface 24b or 24c is guaranteed. As shown, a light-emitting diode 40 and photodetector 42 can be used, as will be detailed further below, to determine when the registration pin contacts the registration surface. Alternatively, the pin and bar can be arranged in a current detection circuit, as will be described further below.

Figure 5:
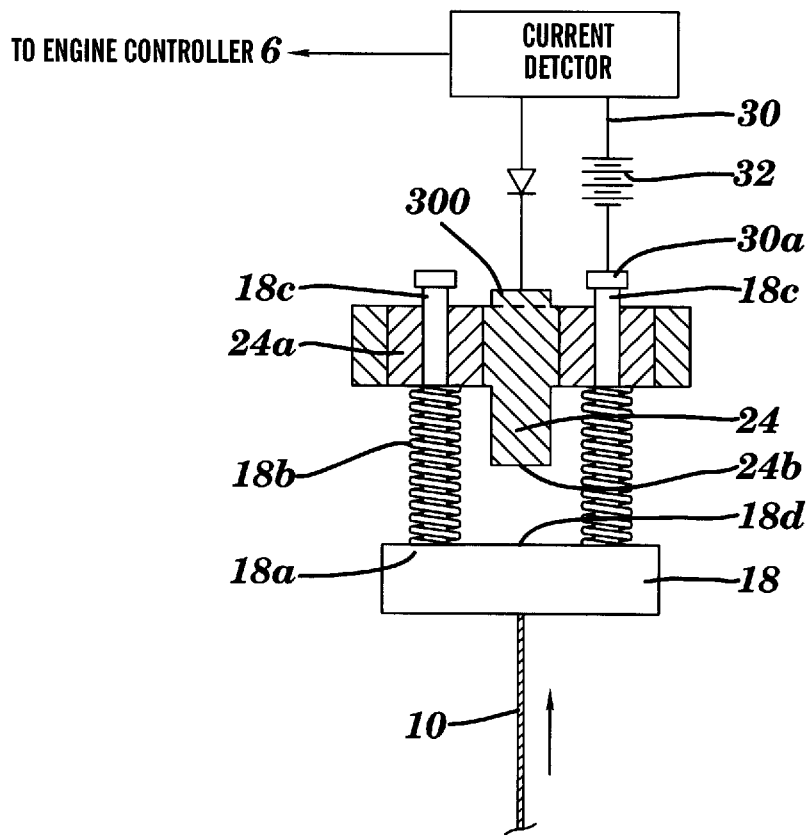
FIG. 5 details a first configuration of the registration pin and registration bar depicted in FIG. 1.

FIG. 5 depicts a first configuration of the registration pin 18 and registration bar 24 which provides information to the engine controller, and hence to the system operator, regarding the proper alignment of the loaded medium. As shown in FIG. 5, the sheet of medium 10' being loaded onto the support surface 22 of the cylindrical drum 20 makes contact with the registration pin member 18a which is spring mounted on slide pins 18c. The springs 18b have one end abutting the pin member 18a and a second end abutting the insulating bushings 24a which are installed in an elongated aperture formed along substantially the entire length of the registration bar 24.

The detector circuit 30 is connected to a power source 32, and by a connector 30a to one of the slide pins 18c of the registration pin 18 and by connector 30b to the registration bar 24. The detector circuit 30 also includes a current detector 30c which detects a current through the detection circuit 30 when the pin member 18a of the registration pin 18 contacts the registration bar 24. As indicated, this contact occurs when contact surface 18d of the pin member 18a makes contact with contact surface 24b of the registration bar 24.

Once contact is made, a current flows to the current detector 30c which generates a signal to the engine controller 6 indicative of the registration pin member 18a having moved to a point of contact with the registration bar 24. As will be further discussed below, the detection of the contact between the registration pin 18 and the registration bar 24 can be used to determine if the loaded plate 10' has been properly positioned within the cylindrical drum 20. It should be noted that, using the FIG. 5 configuration, even if the medium 10' is formed of a non-metallic material. Hence, an electrical circuit can still be utilized to detect the registration alignment of media on the mounting surface 22 even if the media is not electrically conductive.

Figure 6B:
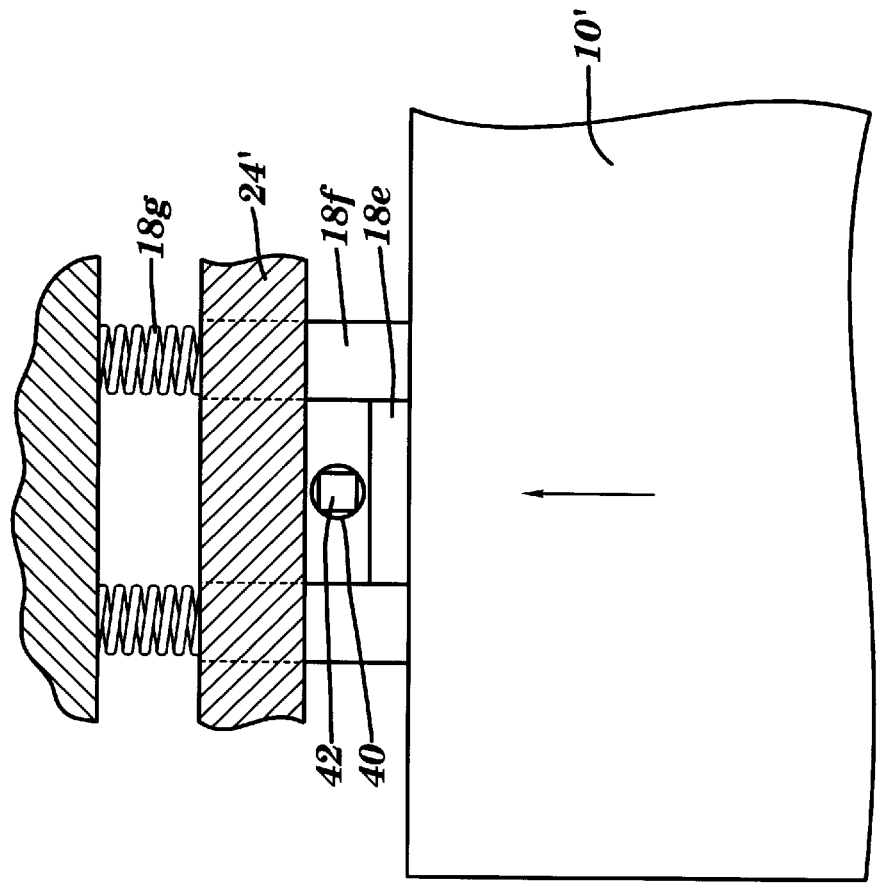
FIG. 6 details a second configuration of the registration pin and registration bar depicted in FIG. 1.
FIG. 6A is another view of the pin and registration bar of FIG. 6.

FIG. 6 depicts an alternative configuration which can be used to ensure proper alignment of the medium 10' on the cylindrical drum mounting surface 22. As depicted, the registration pin 18' includes a registration pin member 18e and slide members 18f. The slide members 18f are mounted to a springs 18g which are designed to allow movement of the pin member 18e towards and away from the contact surface 24c of the registration bar 24'. The slide pins 18f pass through an elongated aperture formed along substantially the full length of the registration bar 24' and are supported by a bushings 24e disposed therein.

A light emitting diode (LED) 40 is provided to emit a radiating light beam which passes between the registration pin member 18e and the register bar 24' when not in contact. The light is detected by the photodiode 42 which generates a signal to the engine controller 6 indicative of no contact between the registration pin 18' and registration bar 24'. This allows the engine controller 6, and accordingly the system operator, to determine if the medium 10' is properly positioned on the support surface 22 of the cylindrical drum 20 prior to imaging the medium.

Figure 6A:
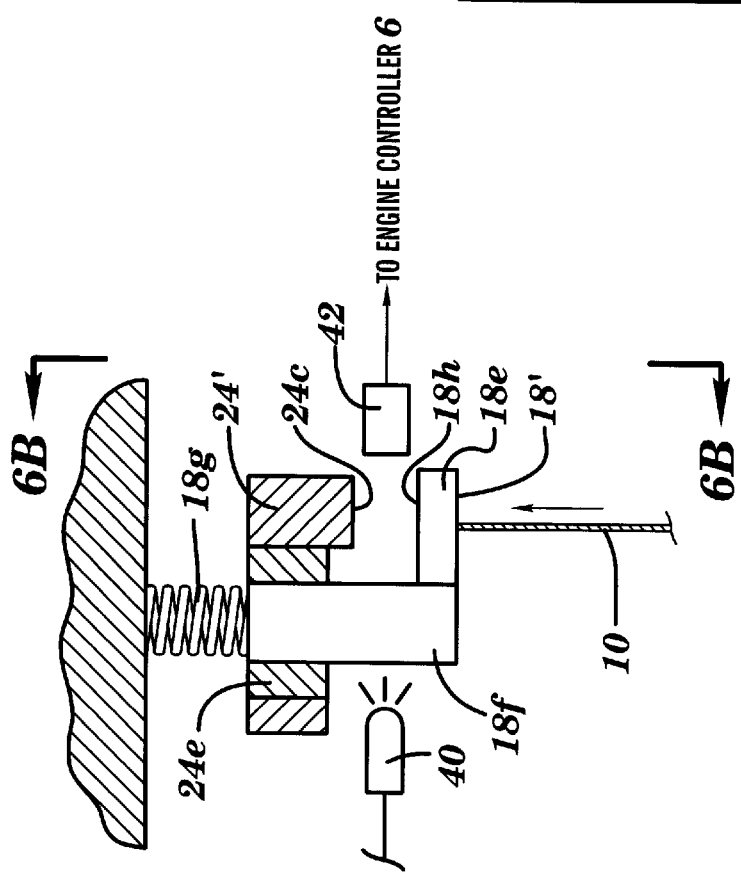

As shown in FIG. 6A, the LED 40 and photodiode 42 are disposed between the slide pins 18f. As the plate 10' moves in the direction of the arrow, the leading edge of the plate 10' makes contact with pin member 18e and pushes the pin 18' such that the slide members 18f force the springs 18g to be compressed and the contact surface 18h of the registration pin 18' to move toward the contact surface 24c of the registration bar 24'. When the contact surfaces 18h and 24c make contact, the light from the LED 40 is totally blocked such that the photodiode 42 ceases to detect the radiating light. The photodiode 42 therefore stops, generating a signal to the engine controller 6 thereby indicating to the engine controller 6, and hence to the system operator, that the media 10' is in proper registration at the applicable registration pin 18'.

Figure 7:
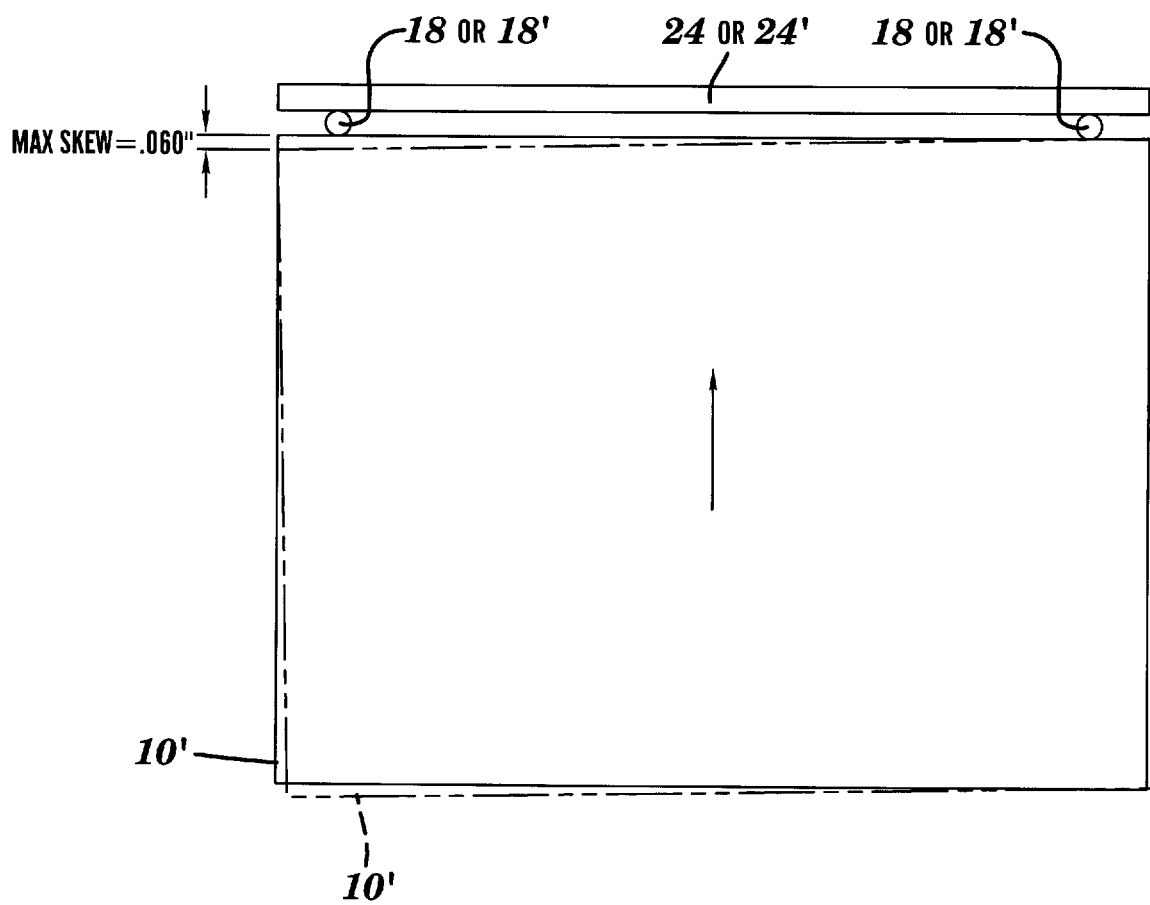
FIG. 7 depicts the medium deskewing movement after contacting the first registration pin.

FIG. 7 shows the movement of the sheet of medium 10' after contact between the first registration pin 18 or 18' positioned proximate to the right side of the plate 10' with the registration bar 24 or 24', while a second registration pin 18 or 18' proximate to the left side of the medium pin has yet to contact the registration bar 24 or 24', with the medium being moved in the direction indicated by the arrow. As shown, a skew of 0.060 inches exists at the left registration pin 18 or 18' when the right pin 18 or 18' contacts the registration bar 24 or 24'. Accordingly, at this point the media 10 is improperly positioned on the support surface 22 of the drum 20.

Because the engine controller 6 is aware that the left registration pin 18 or 18' has yet to contact the registration bar 24 or 24', the applicator 50 continues to move the plate 10' toward the registration bar 24 or 24'. The plate 10', although restricted from further movement toward the registration bar 24 or 24' on the right side of the plate, is able to slightly rotate about the right side registration pin 18 or 18'. This allows the left side of plate 10' to continue to move, pushing the left side registration pin 18 or 18' up against the registration bar 24 or 24' and thereby eliminating the skew as indicated.

At this point, as discussed above, the engine controller 6 is made aware of both registration pins 18 or 18' being in register with the registration bar 24 or 24' and, accordingly, that the medium has been properly positioned for imaging on the support surface 22 of the drum 20. The engine controller thus processes a signal to indicate that positioning is complete and controls the scan assembly 60 to image the medium. The first scan line impinges upon the plate at the desired predefined position from the leading edge of the plate and parallel to the registration bar.

As described in detail above, the present invention provides a registration apparatus capable of detecting the proper positioning of media on a medium support surface prior to imaging. The apparatus ensures proper alignment registration of the medium to be imaged as it is loaded onto the medium support surface and whether or not the medium is electrically conductive.

It will also be recognized by those skilled in the art that, while the invention has been described above in terms of one or more preferred embodiments, it is not limited thereto. Various features and aspects of the above described invention may be used individually or jointly. Further, although the invention has been described in the context of its implementation in a particular environment and for particular purposes, those skilled in the art will recognize that its usefulness is not limited thereto and that the present invention can be beneficially utilized in any number of environments and implementations. Accordingly, the claims set forth below should be construed in view of the full breadth and spirit of the invention as disclosed herein.

We claim:

1. A registration apparatus for positioning a medium on a media support surface, comprising:
    a moveable member configured to be contacted by an edge of a medium and moveable therewith, as the medium is moved to a set position on a support surface; and
    a registration member configured to restrain the movement of the moveable member at a point at which the moveable member contacts the registration member to position the medium at the set position on the support surface.

2. A registration apparatus according to claim 1, wherein:
    the registration member has a reference surface aligned substantially parallel to the edge of the medium with the medium in the set position; and
    the moveable member contacts the reference surface.

3. A registration apparatus according to claim 2, wherein:
    the moveable member is moveable in a direction parallel to the reference surface.

4. A registration apparatus according to claim 3, further comprising:
    a drive mechanism for driving the movement of the moveable member parallel to the reference surface;
    wherein the drive mechanism contacts the contact surface to thereby provide a fixed relative positioning of the moveable member and the reference surface when the moveable member is not in contact with the edge of the medium.

5. A registration apparatus according to claim 1, further comprising:
    a guide mechanism connected to the moveable member and configured to guide the movement of the moveable member towards the registration member.

6. A registration apparatus according to claim 1, further comprising:
    a spring configured to resist the movement of the moveable member towards the registration member.

7. A registration apparatus according to claim 1, wherein the moveable member and the registration member are formed of electrically conductive material, and further comprising:
    an electrical power source; and
    a detection circuit connected to the electrical power source, the circuit having a first connection at the moveable member and a second connection at the registration member;
    wherein contact of the moveable member with the registration member closes the detection circuit.

8. A registration apparatus according to claim 1, further comprising:
    an emitter configured to direct a radiating beam between the moveable member and the registration member; and
    a detector configured to detect the radiating beam passing between the moveable member and the registration member;
    wherein with the moveable member in contact with the registration member the radiating beam is undetectable by the detector.

9. A registration apparatus according to claim 8, wherein, the emitter is a light emitting diode and the detector is a photodetector.

10. An imaging system according to claim 1, wherein the medium is non-metallic.

11. A method of registering the position of a medium on a media support surface, comprising the steps of:

contacting a moveable member with an edge of a medium;

moving the medium, with the medium edge in contact with the moveable member, such that the edge forces a movement of the moveable member as the medium is moved to a set position on a support surface; and restraining the movement of the moveable member at a point at which the moveable member contacts a registration member to position the medium at the set position on the support surface.

12. A method according to claim 11, wherein:

the moveable member contacts the registration member at a reference surface aligned substantially parallel to the edge of the medium with the medium in the set position.

13. A method according to claim 12, further comprising the step of:

moving the moveable member in a direction parallel to the reference surface prior to the medium edge contacting the moveable member.

14. A method according to claim 12, further comprising the step of:

maintaining a fixed relative positioning of the moveable member and the reference surface prior to the edge contacting the moveable member.

15. A method according to claim 11, further comprising the step of:

guiding the movement of the moveable member towards the registration member as the medium is moved to the set position.

16. A method according to claim 15, further comprising the step of:

resisting the movement of the moveable member towards the registration member with a force less than a force applied by the medium edge to force the movement of the moveable member.

17. A method according to claim 11, wherein the moveable member and the registration member are formed of electrically conductive material and the contact of the moveable member with the registration member closes an electrical circuit, and further comprising the step of:

sensing an electrical current in the closed electrical circuit to the detect the contact of the moveable member with the registration member.

18. A method according to claim 11, further comprising the steps of:

directing a radiating beam between the moveable member and the registration member; and detecting the radiating beam passing between the moveable member and the registration member;

wherein the contact of the moveable member with the registration member blocks the detection of the radiating beam.

19. A method according to claim 11, wherein the medium is non-metallic.

* * * * *

UNITED STATES PATENT AND TRADEMARK OFFICE
CERTIFICATE OF CORRECTION

PATENT NO. : 5,889,547
DATED : March 30, 1999
INVENTOR(S) : Rombult et al.

It is certified that error appears in the above-identified patent and that said Letters Patent is hereby corrected as shown below:

Column 4

Line 18, "controller G" should be --controller 6--.

Column 5

Line 21, "181" should be --18'--.

Signed and Sealed this

Twenty-seventh Day of July, 1999

Attest:

Attesting Officer

Q. TODD DICKINSON

Acting Commissioner of Patents and Trademarks